(12) United States Patent
Quach et al.

(10) Patent No.: US 6,505,318 B1
(45) Date of Patent: Jan. 7, 2003

(54) METHOD AND APPARATUS FOR PARTIAL ERROR DETECTION AND CORRECTION OF DIGITAL DATA

(75) Inventors: Nhon Toai Quach, Santa Clara, CA (US); Sunny Huang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/410,500

(22) Filed: Oct. 1, 1999

(51) Int. Cl.[7] .......................... G06F 11/00; H03M 13/00
(52) U.S. Cl. ...................... 714/746; 714/753; 714/774; 714/777
(58) Field of Search .................... 714/746, 761, 714/765, 767, 785, 787, 822, 753, 774, 777; 360/77.06, 77.08, 78.04, 78.14

(56) References Cited

U.S. PATENT DOCUMENTS

| | | | |
|---|---|---|---|
| 2,552,629 A | 5/1951 | Hamming et al. .......... 714/777 |
| 4,541,095 A | * 9/1985 | Vries .......................... 714/785 |
| 4,713,816 A | * 12/1987 | Van Gils .................... 714/765 |
| 5,903,410 A | * 5/1999 | Blaum et al. ............. 360/77.08 |

OTHER PUBLICATIONS

R.W. Hamming, "Error Detecting and Error Correcting Codes," The Bell System Technical Journal, vol. XXVI, Apr. 1950, pp. 147–160.

* cited by examiner

Primary Examiner—Emmanuel L. Moise
(74) Attorney, Agent, or Firm—Blakely, Sokoloff, Taylor & Zafman LLP

(57) ABSTRACT

A method and an apparatus for receiving partially error protected data. A transmission of a binary code is received. The binary code is selected from a first set of codes having a first minimum distance from every other code and a second set of codes having a second minimum distance from every other code. The second minimum distance is greater than the first minimum distance. A first single bit error in the transmission is detected if the transmission is a distance of one unit from one of the codes in the second set of codes.

12 Claims, 1 Drawing Sheet

METHOD AND APPARATUS FOR PARTIAL ERROR DETECTION AND CORRECTION OF DIGITAL DATA

BACKGROUND OF THE INVENTION

1. Field of the Invention

This invention relates to error detecting and correcting codes.

2. Background Information

It is axiomatic that data entering a data processor, whether it originates in a local memory, or is received from a remote source via a communication link, must be correct. For this reason many error detecting codes (EDC) and error correcting codes (ECC) have been developed to insure the integrity of the information to be processed. Common to all of these codes is redundancy, wherein additional bits are added to the information bits, as a function thereof, to permit the algorithm controlling the check bits to be recomputed at the destination for error detection and possible correction, if the code is sufficiently redundant. Computer memories are an example of a source of data entering a data processor where it is advantageous to use error detecting and error correcting codes. The most likely source of errors in computer memories is corruption of the data during the time the data is held in the memory. Such soft (intermittent) errors may be induced by background cosmic radiation and alpha particle bombardment.

It is well known in the prior art to add a parity bit to units of data being stored in computer memories to detect a single bit error in the data unit when the unit is read. Typically, a parity bit is added for each 8 bit byte of data in the memory. Thus, 9 bits of storage are used for each 8 bit byte of data storage provided. Parity protected memories are limited in that the process requesting faulty data only knows that the data is faulty. There is no general mechanism to allow the process to recover from the error. Most often, a memory fault requires that the process accessing the faulty memory line be terminated or that the system be rebooted. It is also well known in the prior art to add error correction codes to units of data being stored to detect and correct errors. This provides a system that can recover from detected errors. For example, a 32 bit computer word can be protected by adding a 6 bit ECC. The ECC allows all single bit errors to be detected and corrected. A 7 bit ECC detects and corrects single bit errors and also detects double bit errors.

One class of error correcting codes, known as Hamming codes, is described by R. W. Hamming in "Error Detecting and Error Correcting Codes", Bell Systems Technical Journal, 29, 1950, pages 147–160. Hamming described several specific instances of Hamming codes. The specific codes described were single error detection codes (SED), single error correction codes (SEC), and single error correction, double error detection codes (SEC/DED). Error correcting code theory and applications are treated in the text "Error Control Coding, Fundamentals and Applications" by Lin et al., published by Prentice-Hall, 1982.

The correction capabilities of any code is dependent upon redundancy. In the simplest case of a SED, a single parity bit, the redundancy is very low and there are no correction possibilities. In fact, two compensating errors will not be detected, as the parity is unchanged. A Hamming SEC is more redundant, with the number of redundant ECC bits related to the number of information bits that are to be protected. Three ECC bits are required to provide SEC for two to four information bits. When error correcting codes are used to protect a small number of information bits, the redundancy becomes very high.

In standard coding theory notation, "k" represents the number of data bits in a code word, "r" represents the number of check bits in the code word, and "n" represents the total number of bits in a code word (n=k+r). According to Hamming, a single error correcting code must satisfy the equation $2^r \geq k+r+1$.

A geometric model is sometimes used to examine problems of error detection and correction. The n bits of a code are viewed as the vertices of an n-dimensional unit cube. This is readily visualized for n=3. As shown in FIG. 1, a 3 dimensional unit cube 100 has eight vertices: (0,0,0), (0,0,1), (0,1,0), (0,1,1), (1,0,0), (1,0,1), (1,1,0), (1,1,1). Starting from (0,0,0) and moving the distance of 1 unit along an edge takes us to (0,0,1), (0,1,0), or (1,0,0). Moving a distance of 1 unit means that the value of one coordinate is changed. Starting from (0,0,0) and moving the distance of 2 units along an edge takes us to (0,1,1), (1,0,1), or (1,1,0). Moving a distance of 2 unit means that the value of two coordinates are changed.

An error is the unexpected change in value of one or bits in the code. A single bit error changes the value of one coordinate so that a single bit error code will be a distance of 1 from the original valid code symbol. If all the possible $2^n$ code symbols of an n bit code are valid code symbols, then errors will produce other valid code symbols and no error detection or correction is possible.

To obtain an error detecting code or an error correcting code of n bits, the valid code symbols must be a subset of all the possible $2^n$ code symbols. If all the valid code symbols are separated by a distance of 2, then a code symbol with a single bit error will change one coordinate and be at a distance of 1 from the original valid code symbol. However, the code symbol with a single bit error will also be at a distance of 1 from additional valid code symbols other than the original valid code symbol because valid code symbols are separated by a distance of 2. Therefore, a code where all the valid code symbols are separated by a distance of 2 is a single bit error detecting code. If the distance between the valid code symbols is increased to 3, then a code symbol with a single bit error will be at a distance of 1 from the original valid code symbol and at a distance of 2 or more from all other valid code symbols. Thus, a code where all the valid code symbols are separated by a distance of 3 is a single bit error correcting code.

An exemplary application of error correcting codes is in the area of cache memory coherency state bits. To speed memory access, computers often use cache memory, which is a small high speed memory that provides fast access to a copy of the data in current use. When more than one device can write to the memory, a mechanism must be provided to maintain cache coherency. The activity of one device may invalidate the contents of a cache or main memory as used by another device. One cache coherency protocol well-known in the art is the MESI Protocol. The name is derived from four states which are maintained for the status of each line in the cache memory: Modified, Exclusive, Shared, and Invalid (MESI). The state is maintained by status bits associated with each cache line. While two bits are sufficient to maintain the four states, the status is typically protected by an ECC because of the grave consequences of an error in these bits. Three additional bits are required to provide an ECC for two data bits. Therefore, five status bits per line of cache memory are required.

SUMMARY

Briefly, one embodiment of the invention is method for receiving partially error protected data. The method comprises receiving a transmission of a binary code. The binary code is selected from a first set of codes having a first minimum distance from every other code and a second set of codes having a second minimum distance from every other code. The second minimum distance is greater than the first minimum distance. The method further comprises detecting a first single bit error in the transmission if the transmission is a distance of one unit from one of the codes in the second set of codes.

DETAILED DESCRIPTION OF THE INVENTION

The present invention provides a method and apparatus for partial error detection and correction of digital data. A set of code symbols is provided having one subset of code symbols with one level of error detection or correction and another subset of code symbols with a greater level of error detection or correction. One example of a code that embodies the present invention provides a first subset of symbols where single bit errors cannot be detected and a second subset of symbols where single bit errors can be detected but not corrected. Another exemplary embodiment of a code according to the present invention provides a first subset of symbols where single bit errors can be detected but not corrected and a second subset of symbols where single bit errors can be detected and corrected. Other combinations of levels of error protection are also possible. It is also possible to provide more than two subsets of code symbols with differing levels of error protection in one set code of code symbols. In applications where an error in certain symbols is more critical than in other symbols, codes with partial error protection and correction provide a more efficient use of bits.

The codes of the present invention have symbols that can be grouped into two or more sets of symbols where all the symbols in one set are at a first minimum distance from other symbols while the symbols in another set are at a second, larger, minimum distance from other symbols. The degree of error protection provided is determined by the minimum distance the symbols in the set are from all other symbols.

A very simple embodiment of a code according to the present invention would be a 3 bit code that provides 4 symbols with no error detection and 1 symbol with single-bit error detection. The symbols in the first set are at a minimum distance of 1 from other symbols while the symbol in the second set is at a minimum distance of 2 from other symbols. One embodiment of the invention uses the following selection of symbols:

First Set: (0,0,0), (0,0,1), (0,1,0), (1,0,0)
Error Codes: (0,1,1), (1,0,1), (1,1,0)
Second Set: (1,1,1)

Figure 1:
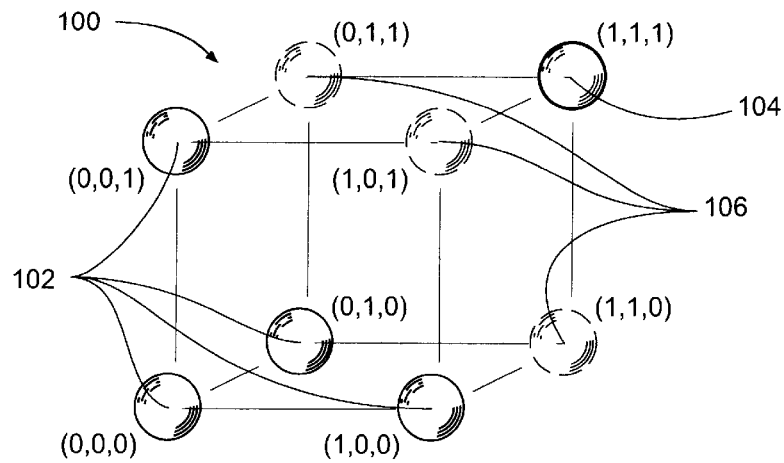
FIG. 1 shows a geometric model of an embodiment of the present invention that provides a code with four unprotected symbols and one symbol protected by error detection.

This can be visualized geometrically as a three-dimensional cube as shown in FIG. 1. A one bit error in a symbol from the first set 102 may produce another valid symbol. Hence, no error detection is possible for symbols from the first set. A one bit error in the second set symbol 104 will produce an error code 106. However, because (1,1,1) is distance 2 from some symbols in the first set 102, the error cannot be corrected. The error code 106 could also be a single bit error in a first symbol that is distance 2 from (1,1,1). A code with 5 symbols requires at least 3 bits. In prior art codes, an additional parity bit would be added to provide error detection for all symbols yielding a 4 bit code. Using a code that embodies the present invention, 1 symbol in a 5 symbol code can have error detection using only 3 bits.

Another embodiment of the present invention provides a 4 bit code with 4 symbols having a minimum distance of 2 to provide error detection and 1 symbol having a minimum distance of 3 to provide error correction. One embodiment of the invention uses the following selection of symbols:

Error Codes A: (0,0,0,0)
First Set: (0,0,0,1), (0,0,1,0), (0,1,0,0), (1,0,0,0)
Error Codes B: (0,0,1,1), (0,1,0,1), (0,1,1,0), (1,0,0,1), (1,0,1,0), (1,1,0,0)
Error Codes C: (0,1,1,1), (1,0,1,1), (1,1,0,1), (1,1,1,0)
Second Set: (1,1,1,1)

The 4 symbols of the first set provide error detection because they are distance 2 from each other and distance 1 from the error codes in groups A and B. The symbol (1,1,1,1) in the second set provides error correction because it is distance 3 from the other symbols. A single bit error in symbol (1,1,1,1) will result in one of the error codes in group C at distance 1. It may be observed that all symbols in the first set have exactly 1 bit set. The single bit errors for the first set have either no bits set, group A, or exactly 2 bits set, group B. The second set symbol has all bits set. The single bit errors for the second set have exactly 3 bits set, group C. These bit relationships for this particular selection of symbols in this embodiment of the invention can be advantageous in the mechanization of the error detection and correction apparatus.

The above embodiment of a code according to the present invention is advantageously applied to the cache coherency bits of a cache memory employing the MESI protocol. The Modified state is critical because it indicates that the cache line is more current than main memory. If the cache line is in the Modified state, the cache line must be written to main memory before any other device attempts to read from that main memory location. The Exclusive, Shared, and Invalid states are less critical. The Exclusive and Shared states indicate that the cache has a valid copy of the contents of main memory, with Exclusive indicating that the cache copy is available for writing. The Invalid state, of course, means that the cache does not have a valid content. If an error is detected in the Exclusive, Shared, or Invalid states, the state may be set to Invalid without harm other than an added main memory access. Thus, error detection provides adequate protection for these three states, while error correction is required only for the Modified state. The E, S, and I symbols are chosen from the first set of symbols and the M symbol is the second set symbol.

In one particular embodiment, E could be represented by (0,1,0,0), S by (0,0,1,0), and I by (0,0,0,1). The symbol (1,0,0,0) from the first set is unused. M would be represented by (1,1,1,1) in this embodiment. When a detectable but uncorrectable error is detected, error codes A or B, the error code is replaced by the "I" symbol. Correctable errors, group C, are replaced by the M symbol. If the input symbol is represented as (A,B,C,D), the following table shows the values that result from all possible inputs and indicates the detected and corrected errors:

| A | B | C | D | Output State | Error Detected | Error Corrected |
|---|---|---|---|---|---|---|
| 0 | 0 | 0 | 0 | I | X | |
| 0 | 0 | 0 | 1 | I | | |
| 0 | 0 | 1 | 0 | S | | |
| 0 | 0 | 1 | 1 | I | X | |
| 0 | 1 | 0 | 0 | E | | |
| 0 | 1 | 0 | 1 | I | X | |
| 0 | 1 | 1 | 0 | I | X | |
| 0 | 1 | 1 | 1 | M | | X |
| 1 | 0 | 0 | 0 | I | * | |
| 1 | 0 | 0 | 1 | I | X | |
| 1 | 0 | 1 | 0 | I | X | |
| 1 | 0 | 1 | 1 | M | | X |
| 1 | 1 | 0 | 0 | I | X | |
| 1 | 1 | 0 | 1 | M | | X |
| 1 | 1 | 1 | 0 | M | | X |
| 1 | 1 | 1 | 1 | M | | |

*Valid but unused symbol, corrected to I.

Figure 2:
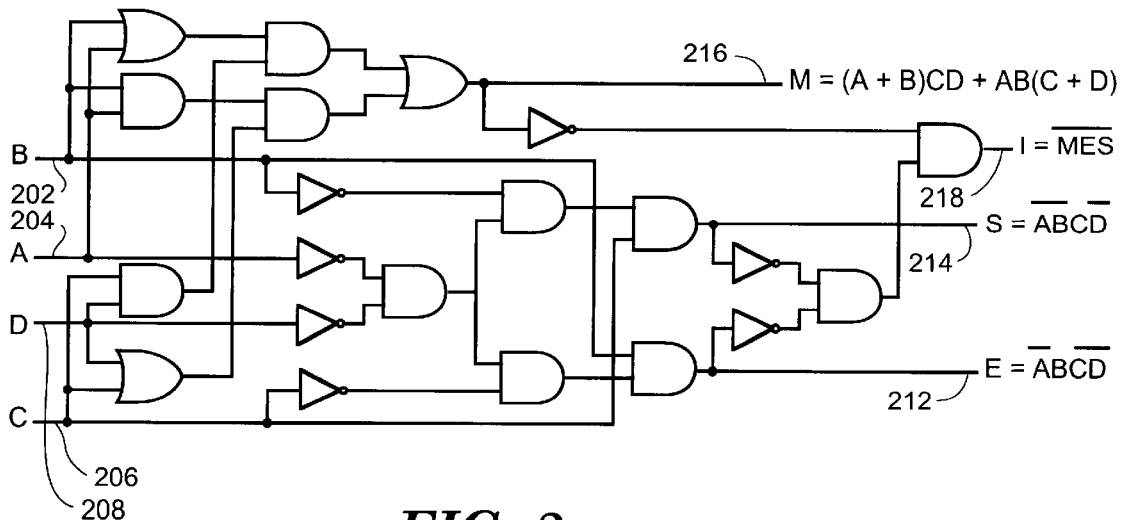
FIG. 2 shows a logic circuit for an embodiment of the present invention that provides a protected code for use with cache coherency state bits.

FIG. 2 shows one illustrative embodiment of a logic circuit in a register that receives inputs representing the embodiment of a four bit code according to the present invention as shown in the table above and provides outputs representing the corrected symbols. The register produces four corrected output states based on the sixteen possible uncorrected input states. The output states can be represented using the same correctable code as the inputs or any other suitable code as required by a particular application of the invention. The E output state 212 is determined by detecting that the B input 204 is asserted and that the A, C, and D inputs 202, 206, 208 are not. The S output state 214 is determined by detecting that the C input 206 is asserted and that the A, B, and D inputs 202, 204, 208 are not. The E and S output states each correspond to exactly one input state because there is no error correction provided for these states. The M output state 216 is determined by detecting all the input states where at least three of the inputs are asserted. This includes the correct M input state where all four inputs are asserted and the four correctable M input states where three of the inputs are asserted. All remaining states are interpreted as the I output state 218. This includes the correct I input state where the D input 208 is asserted and the A, B, and C inputs 202, 204, 206 are not, the detectable error input states, and the unused symbol input state. The I state is detected as not the M, E, or S states rather than directly decoding the input states. This embodiment of the present invention provides a 4 bit code for the MESI protocol that provides error protection that is as effective as a 5 bit ECC of the prior art with a negligible loss of performance.

While certain exemplary embodiments have been described, it is to be understood that such embodiments are merely illustrative of and not restrictive on the broad invention, and that this invention not be limited to the specific constructions and arrangements shown and described, since various other modifications may occur to those ordinarily skilled in the art. In particular, the invention is not limited to use in cache coherency state bits.

What is claimed is:

1. A method for receiving partially error protected data comprising:

receiving a transmission of a binary code, the binary code being selected from a first set of codes having a first minimum distance from every other code and a second set of codes having a second minimum distance from every other code, said second minimum distance being greater than said first minimum distance; and detecting a first single bit error in the transmission if the transmission is a distance of one unit from one of the codes in the second set of codes.

2. The method of claim 1, where the first minimum distance is two units and the second minimum distance is three units, further comprising:

detecting a second single bit error in the transmission if the transmission is a distance of one unit from one of the codes in the first set of codes; and correcting the first single bit error in the transmission, if detected, by replacing the transmission with a corrected code selected from the second set of codes as having a distance of one unit from the transmission.

3. The method of claim 2, further comprising replacing the transmission with a predetermined code from the first set of codes if the second single bit error is detected.

4. The method of claim 3, where the transmission consists of four binary digits, the first set of codes consists of codes having three binary digits with a first value and one binary digit with a second value, and the second set of codes consists of a code having all four binary digits with the second value.

5. The method of claim 4, where correcting the first single bit error comprises replacing the transmission with a corrected data signal, where all four binary digits have the second value, if three binary digits have the second value and one binary digit has the first value.

6. The method of claim 4, where detecting the second single bit error comprises detecting if all four binary digits have the first value or if two binary digits have the first value and two binary digits have the second value.

7. A receiver with partial error protection comprising:

a register to receive a transmission of a binary code as a register value, the binary code is selected from a first set of codes having a first minimum distance from every other code and a second set of codes having a second minimum distance from every other code, said second minimum distance being greater than said first minimum distance; and a first error detection circuit to detect a first single bit error in the transmission if the register value is a distance of one unit from one of the codes in the second set of codes.

8. The receiver of claim 7, where the first minimum distance is two units and the second minimum distance is three units, further comprising:

a second error detection circuit to detect a second single bit error in the transmission if the transmission is a distance of one unit from one of the codes in the first set of codes; and a first correction circuit to correct the first single bit error, if detected, by replacing the register value with a corrected code selected from the second set of codes as having a distance of one unit from the register value.

9. The receiver of claim 8, further comprising a second correction circuit to correct the second single bit error, if detected, by replacing the register value with a predetermined code from the first set of codes.

10. The receiver of claim 9, where the transmission consists of four binary digits, the first set of codes consisting of codes with three binary digits having a first value and one binary digit having a second value, and the second set of codes consisting of a code with all four binary digits having the second value.

11. The receiver of claim 10, where the first correction circuit replaces the register value with a corrected data signal with all four binary digits having the second value, if three binary digits have the second value and one binary digit has the first value.

12. The receiver of claim 10, where the second error detection circuit detects the second single bit error if all four binary digits have the first value or if two binary digits have the first value and two binary digits have the second value.

* * * * *